(12) United States Patent
Tanaka

(10) Patent No.: US 12,114,434 B2
(45) Date of Patent: Oct. 8, 2024

(54) METHOD OF MOUNTING ELECTRONIC COMPONENT, SUBSTRATE AND AN OPTICAL SCANNING APPARATUS

(71) Applicant: CANON KABUSHIKI KAISHA, Tokyo (JP)

(72) Inventor: Shunsuke Tanaka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 851 days.

(21) Appl. No.: 17/138,667

(22) Filed: Dec. 30, 2020

(65) Prior Publication Data

US 2021/0212217 A1    Jul. 8, 2021

(30) Foreign Application Priority Data

Jan. 8, 2020  (JP) ................................. 2020-001342

(51) Int. Cl.
  *H05K 3/34*    (2006.01)
  *G03G 15/04*   (2006.01)
  *H05K 1/09*    (2006.01)

(52) U.S. Cl.
  CPC ..... *H05K 3/3485* (2020.08); *G03G 15/04036* (2013.01); *H05K 1/09* (2013.01); *H05K 2201/0355* (2013.01); *H05K 2201/10121* (2013.01); *H05K 2201/1034* (2013.01)

(58) Field of Classification Search
  None
  See application file for complete search history.

(56) References Cited

FOREIGN PATENT DOCUMENTS

| JP | H02260596 A | 10/1990 |
|----|-------------|---------|
| JP | 2003222811 A | 8/2003 |
| JP | 2014162047 A | 9/2014 |
| JP | 2018014437 A | 1/2018 |
| WO | 9526047 A | 9/1995 |

OTHER PUBLICATIONS

English machine translation of Ushifua et al. (JP 2014162047 A) (Year: 2014).*

* cited by examiner

*Primary Examiner* — Walter L Lindsay, Jr.
*Assistant Examiner* — Geoffrey T Evans
(74) *Attorney, Agent, or Firm* — Canon U.S.A., Inc. IP Division

(57) ABSTRACT

The method of mounting an electronic component onto a substrate by a reflow process, the electronic component having at least one first terminal provided along one side of the electronic component and at least one second terminal provided along another side of the electronic component opposed to the one side, the substrate having a first copper foil pattern to which the at least one first terminal is soldered and a second copper foil pattern to which the at least one second terminal is soldered, the method including applying a first solder cream portion to the first copper foil pattern and applying a second solder cream portion to the second copper foil pattern.

6 Claims, 8 Drawing Sheets

METHOD OF MOUNTING ELECTRONIC COMPONENT, SUBSTRATE AND AN OPTICAL SCANNING APPARATUS

BACKGROUND

Field of the Disclosure

The present disclosure relates to a method of mounting an electronic component on a substrate, the substrate, and an optical scanning apparatus having the substrate. Particular, the method of the present disclosure relates to a method of accurate reflow mounting of a component onto a printed circuit board.

Description of the Related Art

In image forming apparatuses such as conventional laser printers, a scanning optical device therein performs the following operations to form an image on a scanned surface. The scanning optical device optically modulates, according to an image signal, a laser beam emitted from a light source. The scanning optical device deflects the optically modulated laser beam toward the scanned surface using, for example, a light deflector having a rotating polygon mirror, and runs the laser beam. The laser beam deflected by the light deflector is run as a spot imaged on the surface of a photosensitive recording medium, for example through a scanning lens of an imaging optical system having an fθ characteristic. The timing of writing by the laser beam on the scanned surface is controlled based on a synchronization signal that is output from a detection unit provided on the scanned surface and that serves as a reference for the write position.

As described in Japanese Patent Application Laid-Open No. 2003-222811, generally, an image is written in an image forming apparatus a predetermined time after the detection of the falling edge of a signal output from a beam detector (hereafter referred to as a BD) serving as the detection unit. In order to prevent the variation in the position to which the BD is attached from affecting the variation in the position in the main-scanning direction, the scanning optical device is configured as follows. The upstream side of a light receiving portion of the BD in the main-scanning direction is hidden by a light shielding member, so that light enters the BD when a laser beam passes over an edge of the light shielding member irrespective of the attachment position of the BD.

Unfortunately, the scanning optical device described in the above conventional example has the problem of difficulty in accurately managing the attachment position of the BD. The light receiving portion of the BD provided in the scanning optical device needs to be of a size larger than the range of variation in the attachment position of the BD. The manufacture cost of the BD, which significantly depends on the size of the light receiving portion, is higher as the light receiving portion is larger. That is, the problem is that using a BD with a large light receiving portion increases the cost of the scanning optical device itself. For reducing the range of variation in the attachment position of the BD to avoid increasing the size of the light receiving portion of the BD, there is a need for a technique of increasing the accuracy of mounting an electronic component such as a BD onto a substrate.

SUMMARY

An aspect of the present invention is a method of mounting an electronic component onto a substrate in a reflow manner, the electronic component having at least one first terminal provided along one side and at least one second terminal provided along another side opposed to the one side, the substrate having a first copper foil pattern to which the first terminal is soldered and a second copper foil pattern to which the second terminal is soldered, the method including application of applying a first solder cream portion to the first copper foil pattern and applying a second solder cream portion to the second copper foil pattern, wherein the application includes: applying the first solder cream portion such that one end of the first solder cream portion facing the second solder cream portion extends toward the second copper foil pattern beyond one end of the first copper foil pattern facing the second copper foil pattern; and applying the second solder cream portion such that one end of the second solder cream portion facing the first solder cream portion extends toward the first copper foil pattern beyond one end of the second copper foil pattern facing the first copper foil pattern.

Another aspect of the present invention is a substrate on which at least one electronic component having at least one first terminal provided along one side of the electronic component and at least one second terminal provided along another side of the electronic component opposed to the one side, the substrate including a first copper foil pattern to which the at least one first terminal is soldered, a second copper foil pattern to which the at least one second terminal is soldered, a first solder portion applied onto the first copper foil pattern, and a second solder portion applied to the second copper foil pattern, wherein one end of the first solder portion facing the second solder portion is applied to extend toward the second copper foil pattern beyond one end of the first copper foil pattern facing the second copper foil pattern, and wherein one end of the second solder portion facing the first solder portion is applied to extend toward the first copper foil pattern beyond one end of the second copper foil pattern facing the first copper foil pattern.

A further aspect of the present invention is a scanning optical apparatus for emitting light an image bearing member, including an electronic component including a first substrate, a light source mounted on the first substrate, and an output unit configure to output a signal in response to receiving light emitted from the light source, the electronic component having at least one first terminal provided along one side of the electronic component and at least one second terminal provided along another side of the electronic component opposed to the one side; and a substrate on which the electronic component is mounted, wherein the substrate includes a first copper foil pattern to which the at least one first terminal is soldered, a second copper foil pattern to which the at least one second terminal is soldered, a first solder portion applied onto the first copper foil pattern, and a second solder portion applied to the second copper foil pattern, wherein one end of the first solder portion facing the second solder portion is applied to extend toward the second copper foil pattern beyond one end of the first copper foil pattern facing the second copper foil pattern, and wherein one end of the second solder portion facing the first solder portion is applied to extend toward the first copper foil pattern beyond one end of the second copper foil pattern facing the first copper foil pattern.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiments of the present invention will be described in detail below with reference to the drawings. The scanning direction or the main-scanning direction refers to the direction in which light emitted from a scanning optical device is run by a deflection device. The main-scanning direction is also the direction along the rotational axis of a photosensitive drum. The sub-scanning direction refers to the rotational direction of the photosensitive drum, which is the direction orthogonal to the main-scanning direction.

[Scanning Optical Device]

Figure 1:
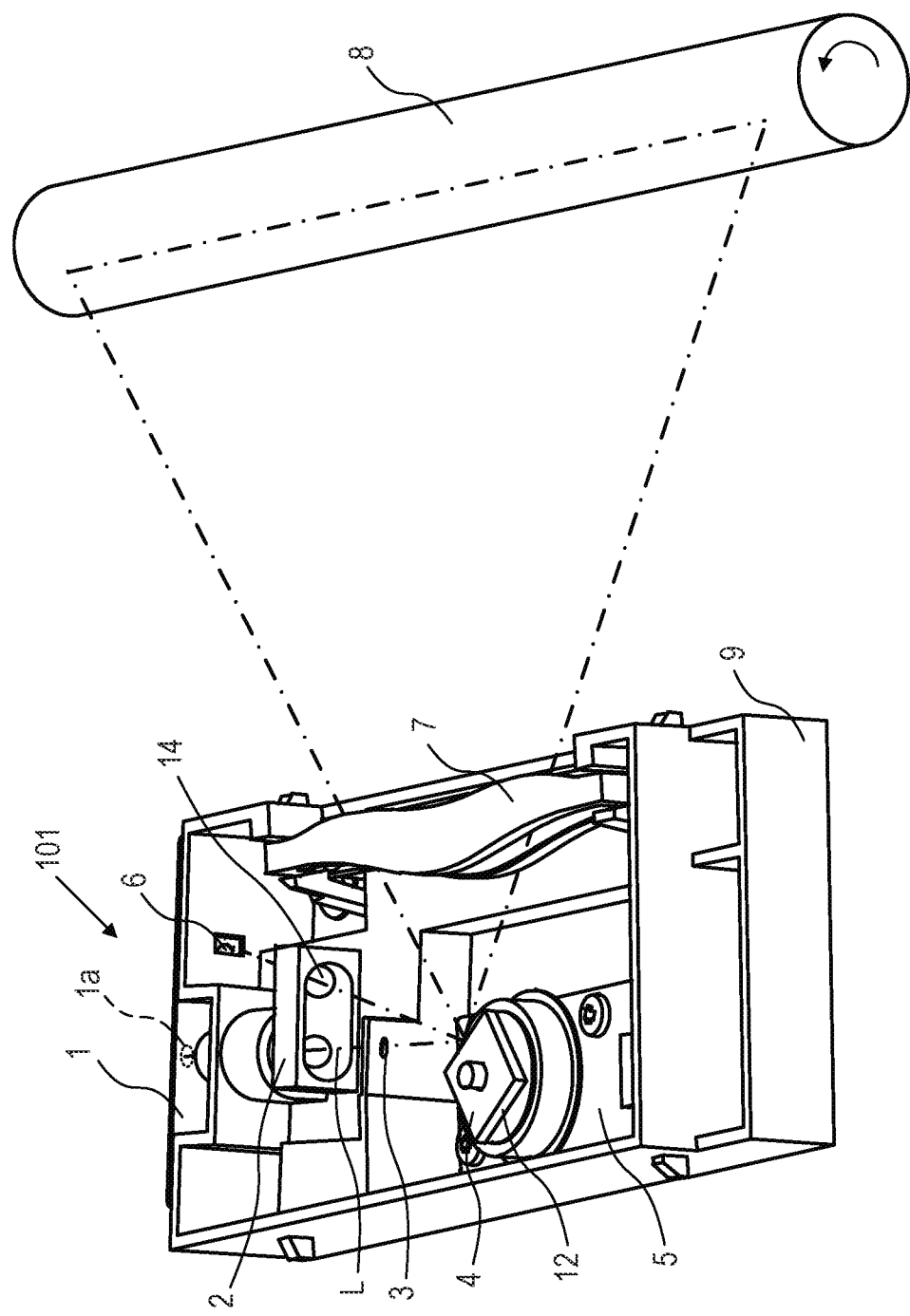
FIG. 1 is a schematic perspective view of a scanning optical device in first and second embodiments.

A scanning optical device in a first embodiment will be described. FIG. 1 is a diagram for describing a scanning optical device 101 in the first embodiment. The scanning optical device 101 includes a laser emission substrate 1 and an anamorphic collimator lens 2. The anamorphic collimator lens 2, hereafter referred to as a collimator lens 2, is an integrated unit of a collimator lens, a cylindrical lens, and a write-position signal detection lens (hereafter referred to as a BD lens) 14. The scanning optical device 101 includes an aperture 3, a rotating polygon mirror 4, a deflection device 5, a beam detector (hereafter referred to as a BD) 6 serving as an output unit, an fθ lens (a scanning lens) 7, and an optical case 9. The rotating polygon mirror 4 has multiple (for example, four in FIG. 1) reflective surfaces 12. The BD 6 has a light receiving portion (see FIGS. 2A, 2B and 2C to be described below), which detects input of laser light in order to output a signal (hereafter referred to as a synchronization signal) serving as a reference for the write position of the laser light in the scanning direction. The optical case 9 houses the above optical members. The scanning optical device 101 forms an electrostatic latent image on the surface of a photosensitive drum 8, which is a photosensitive member.

A semiconductor laser 1a serving as a light source is mounted on the laser emission substrate 1. A laser beam L emitted from the semiconductor laser 1a is collimated by the collimator lens 2 into light substantially parallel or convergent in the main-scanning direction and convergent in the sub-scanning direction. Further, the laser beam L, as a focal-line beam extending long in the main-scanning direction and having a beam width restricted through the aperture 3, forms an image on the reflective surfaces 12 of the rotating polygon mirror 4. The rotating polygon mirror 4 is controlled by the deflection device 5 to rotate at a constant speed. The laser beam L forming the image on the reflective surfaces 12 of the rotating polygon mirror 4 is deflected and run to reach the BD 6 and the photosensitive drum 8 (dashed and single-dotted lines in FIG. 1). The laser beam L enters the BD 6 through the BD lens 14 of the collimator lens 2. The fθ lens 7, formed of a non-spherical lens, is designed to gather light so that the beam passing through the fθ lens 7 forms a spot on the photosensitive drum 8, and to keep the speed of scanning the surface of the photosensitive drum 8 constant. The photosensitive drum 8 is driven to rotate about the cylinder axis, thereby allowing sub-scanning by the laser light. The scanning optical device 101 thus forms an electrostatic latent image on the surface of the photosensitive drum 8.

[Opening in Optical Case, and Light Receiving Portion of BD]

Figure 2A:
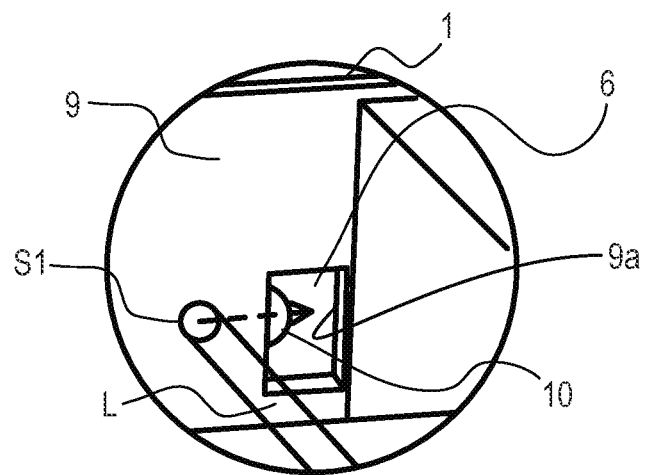
FIGS. 2A, 2B and 2C are diagrams enlarging a main part around a BD of the scanning optical device in the first and second embodiments.
Figure 2B:
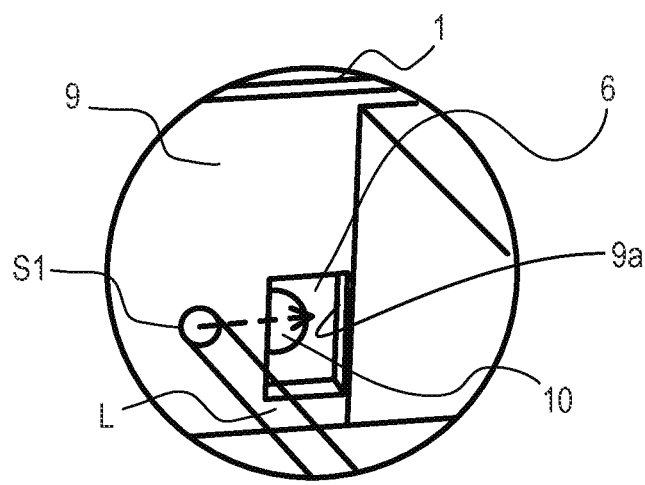
Figure 2C:
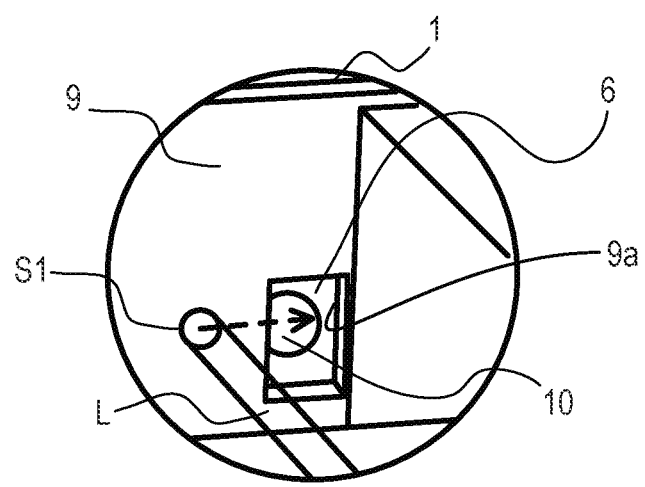

FIGS. 2A, 2B and 2C are diagrams enlarging the BD 6 and its surroundings. The BD 6 has a light receiving portion 10. The BD 6 is mounted on the laser emission substrate 1. The laser emission substrate 1 is attached to a side plate of the optical case 9, which has an opening 9a at a position corresponding to the light receiving portion 10 of the BD 6. The laser beam L passing through the BD lens 14 is formed into a round spot S1 by the BD lens 14 and is run in the direction of dashed-line arrows in FIGS. 2A, 2B and 2C (the scanning direction). Part of the light receiving portion 10 of the BD 6, upstream in the scanning direction of the spot S1, is shaded by the optical case 9. When the moving spot S1 passes over an edge of the opening 9a in the optical case 9, the light enters the light receiving portion 10 to cause the BD 6 to output a signal (hereafter referred to as a horizontal synchronization signal).

FIGS. 2A, 2B and 2C illustrate the BD 6 attached to different positions in the scanning direction. FIG. 2A illustrates the BD 6 attached to a position displaced upstream in the main-scanning direction. FIG. 2B illustrates the BD 6 attached to a position that is substantially the designed center position. FIG. 2C illustrates the BD 6 attached to a position displaced downstream in the main-scanning direction. As described above, the laser light enters the light receiving portion 10 when the moving spot S1 passes over the edge of the opening 9a in the optical case 9. Therefore, the differences in the attachment position of the BD 6 make no difference in the output timing of the horizontal synchronization signal. However, the light receiving portion 10 of the BD 6 needs to be of a size larger than the range of variation in the attachment position of the BD 6.

If the light receiving portion 10 is shorter in length in the scanning direction than the range of variation in the attachment position of the BD 6, the following problem arises. For example, consider the BD 6 attached to a position displaced upstream in the main-scanning direction as shown in FIG. 2A. If the light receiving portion 10 is shorter in length in the scanning direction than the range of variation in the attachment position, the light receiving portion 10 is completely hidden behind the optical case 9 (to the left of the opening 9a). The BD 6 then cannot receive the light with the light receiving portion 10 and therefore cannot output the horizontal synchronization signal. Conversely, consider the BD 6 attached to a position displaced downstream in the main-scanning direction as shown in FIG. 2C. If the light receiving portion 10 is shorter in length in the scanning direction than the range of variation in the attachment position of the BD 6, the upstream side of the light receiving portion 10 is not shaded by the optical case 9. That is, the spot S1 reaches the edge of the opening 9a and then the light receiving portion 10 at different points of time. The BD 6 therefore outputs the horizontal synchronization signal when the spot S1 passes over the upstream side of the light receiving portion 10, rather than when the spot S1 passes over the edge of the opening 9a in the optical case 9. The first embodiment aims to increase the accuracy of the attachment position of the BD 6 so that the range of variation in the attachment position of the BD 6 is kept within the size of the light receiving portion 10.

[Attaching Laser Emission Substrate]

Factors that determine the attachment position of the BD 6 will be described with reference to FIG. 3. Factors that determine the attachment position of the BD 6 include (1) the variation in the position of the laser emission substrate 1 on the optical case 9, and (2) the variation in the mounting position of the BD 6 on the laser emission substrate 1.

Figure 3:
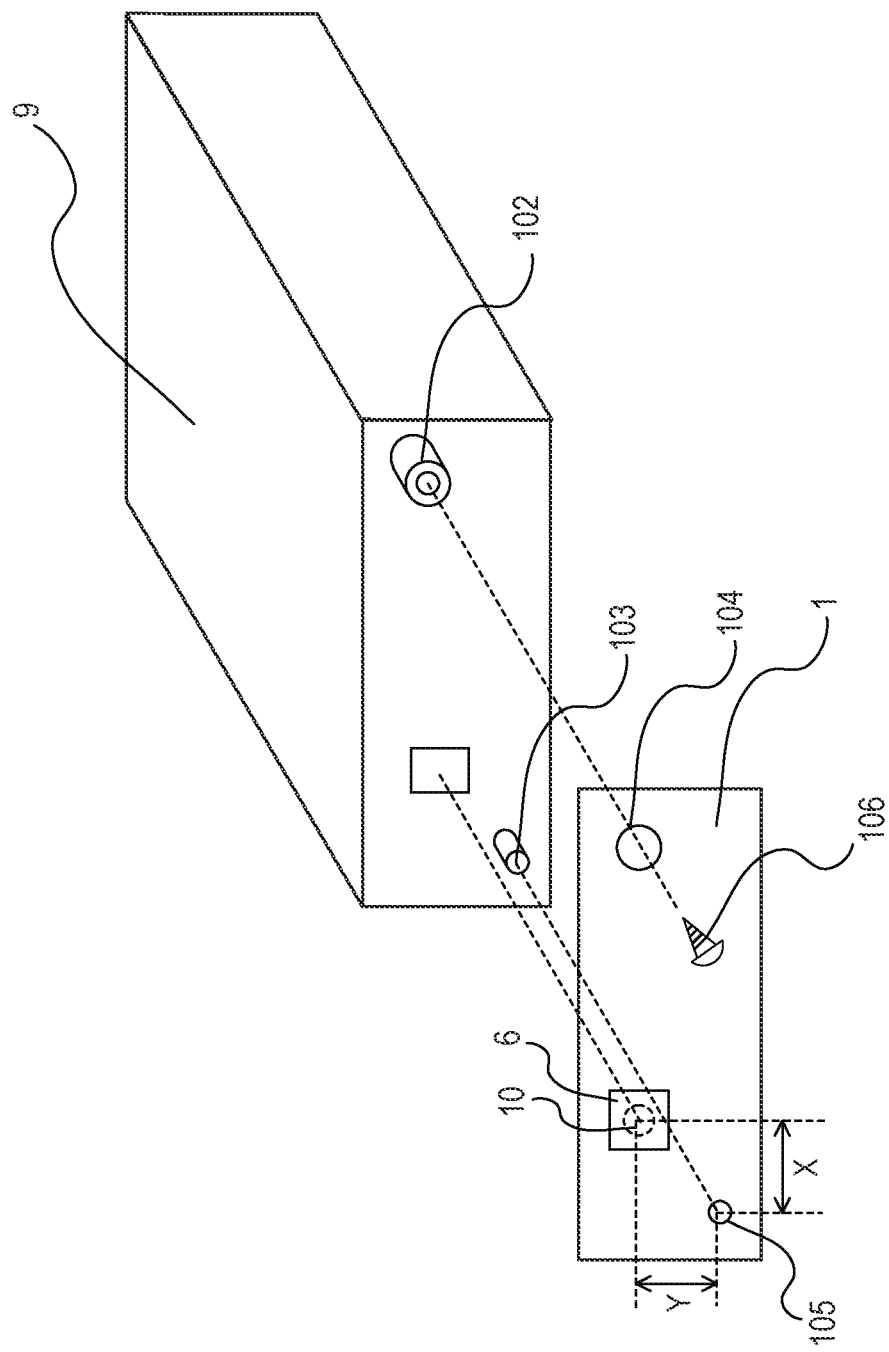
FIG. 3 is a diagram for describing attachment of a laser emission substrate of the scanning optical device in the first and second embodiments.

FIG. 3 is a diagram of the optical case 9 viewed from the direction of the laser emission substrate 1. The laser emission substrate 1 is externally attached to a side plate of the optical case 9. The optical case 9 has a positioning boss 103 and a position fixing hole 102, while the laser emission substrate 1 has an attachment reference hole 105 and an attachment hole 104. The above-listed factor, (1) the variation in the position of the laser emission substrate 1 on the optical case 9, depends on the fit between the attachment reference hole 105 and the positioning boss 103, and the fit between the attachment hole 104 and the position fixing hole 102. A screw 106 is screwed into and fixed to the position fixing hole 102 penetrating through the attachment hole 104. While the management manner of the dimensions of the attachment reference hole 105 and the positioning boss 103 is important, in practice, the dimensions are typically managed with an attachment tolerance of, e.g., about ±0.1 mm The first embodiment reduces the range of the above-listed factor, (2) the variation in the mounting position of the BD 6 on the laser emission substrate 1. That is, the first embodiment proposes a method of mounting the BD 6, which is an electronic component, onto the laser emission substrate 1, which is a substrate. In addition to the BD 6, components such as the semiconductor laser 1a, a laser control driver IC, a chip resistor, and connectors (which are all not shown) are mounted onto the laser emission substrate 1. Each component is mounted by an automatic machine at predetermined mounting coordinates with reference to the attachment reference hole 105. X and Y in FIG. 3 denote coordinates of the position where the BD 6 should be mounted (for example, the center position of the BD 6) with reference to the center coordinates of the attachment reference hole 105. To accurately mount the BD 6 at the coordinates X, Y on the laser emission substrate 1, it is important to mount the component in proper alignment with a land pattern for mounting the BD 6.

[Geometry of BD]

Figure 4A:
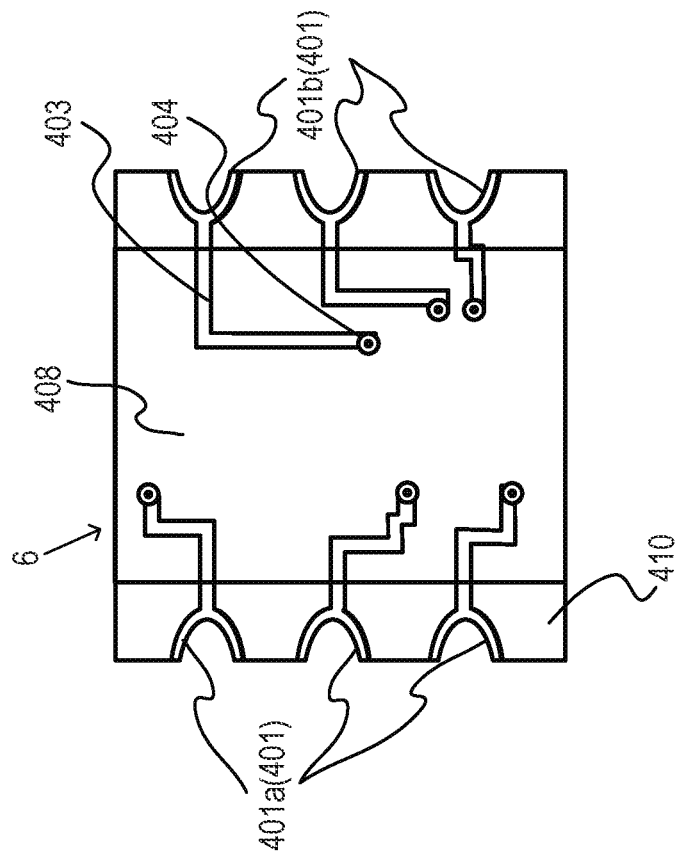
FIGS. 4A, 4B and 4C are diagrams for describing the BD in the first embodiment.
Figure 4B:
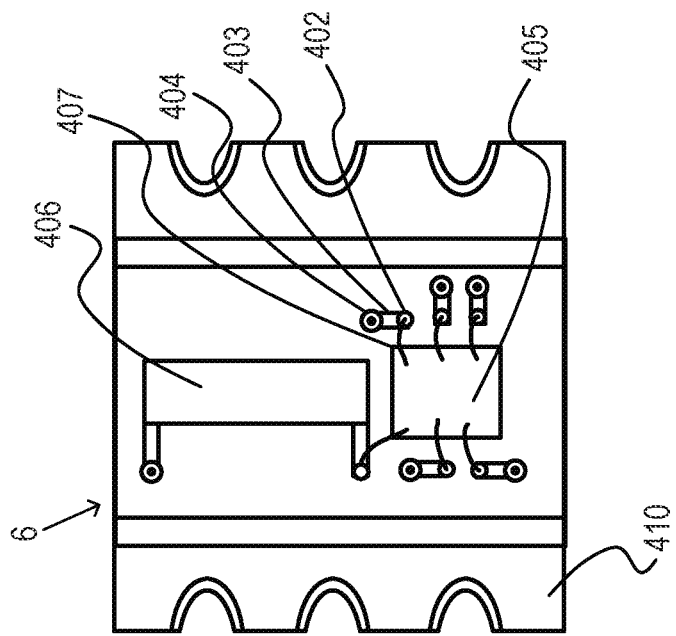
Figure 4C:
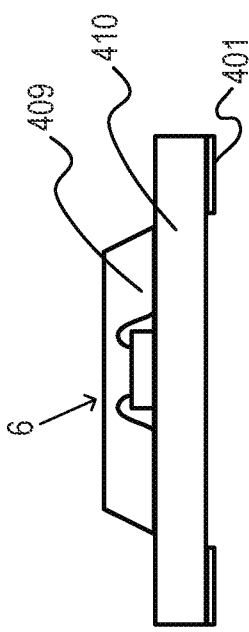

The geometry of the BD 6 will be described with reference to FIGS. 4A, 4B and 4C. The BD 6 used in the first embodiment is of chip-on-board (COB) type; the bare chips of a photodiode 406 and an arithmetic circuit 405 are directly mounted onto a substrate 410. The substrate 410 is rectangular as shown in FIGS. 4A, 4B and 4C, for example. FIG. 4A is a diagram of the BD 6 viewed from a bare chip mounting surface (the front side). The bare chips of the photodiode 406 and the arithmetic circuit 405 are mounted in the central area of the substrate 410 and connected, via gold wires 407, to pads 402 provided on the substrate 410. The pads 402 are connected to a pattern on the back side of the substrate 410 via a pattern 403 and through holes 404.

FIG. 4B is a phantom view of the back side of the BD 6, which is connected to terminals 401 via the through holes 404 and the pattern 403 covered by a resist 408. The terminals 401 represent bare copper foils not covered by the resist 408, and serve as joints for mounting the BD 6 onto the laser emission substrate 1. The terminals 401 are provided on the back side, which is the surface opposite to the mounting surface of the substrate 410. The terminals 401 are provided on two opposing sides of the four sides of the substrate 410. The substrate 410 in the first embodiment has a total of six terminals 401, three on each side, for example. That is, the BD 6, which is an electronic component, has at least one terminal 401a, which is a first terminal, provided along one side of the substrate 410 (three terminals 401a are provided in the first embodiment). The BD 6, which is an electronic component, has at least one terminal 401b, which is a second terminal, provided along another side of the substrate 410 opposed to the one side (three terminals 401b are provided in the first embodiment). FIG. 4C is a side view of the BD 6. As shown in FIG. 4C, the bare chips are protected by a molded transparent acrylic resin 409 that covers the positions where the bare chips are mounted.

[Mounting BD onto Laser Emission Substrate]

Figure 5A:
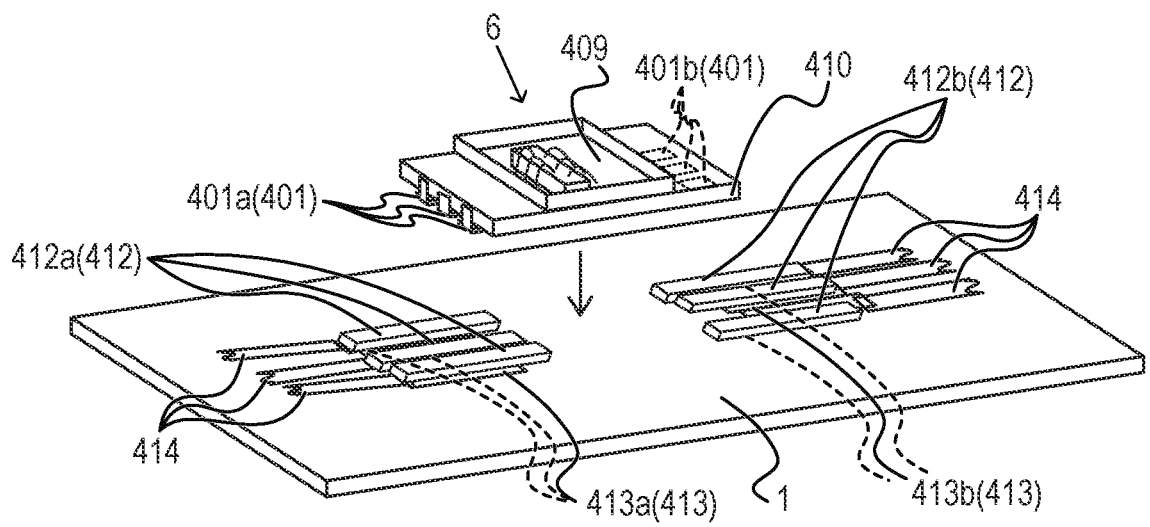
FIGS. 5A and 5B are diagrams for describing a method of mounting an electronic component in a reflow manner in the first embodiment.
Figure 5B:
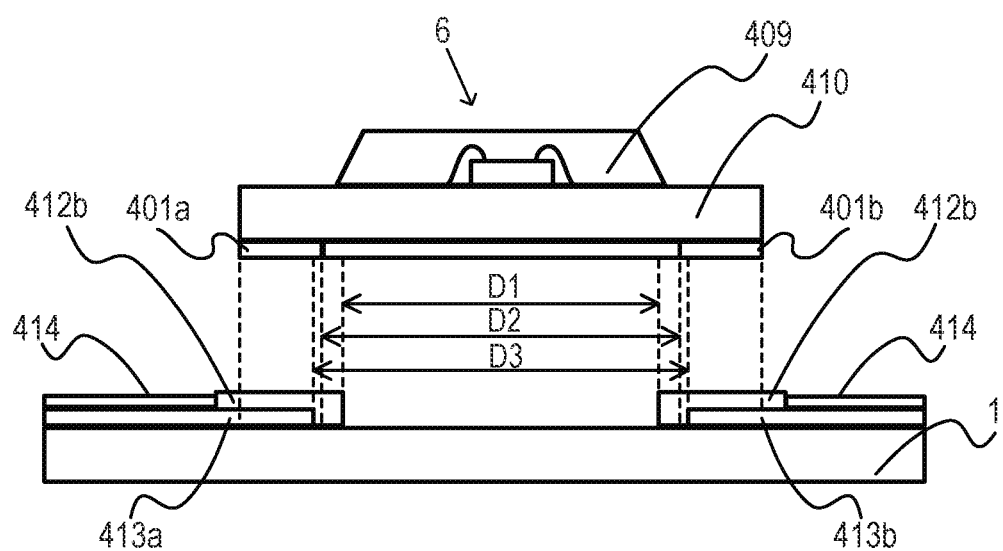

FIGS. 5A and 5B are diagrams for describing mounting the BD 6 onto the laser emission substrate 1 in a reflow manner. As shown in a perspective view of FIG. 5A, patterns for mounting the BD 6 are provided on the laser emission substrate 1. The BD 6 is mounted in an orientation such that the surface having the terminals 401 (the back side) of the BD 6 contacts the laser emission substrate 1. Features of the first embodiment will be described with reference to a cross-sectional view of FIG. 5B.

The laser emission substrate 1 (a substrate) has: a copper foil pattern 413a, which is a first copper foil pattern, to which the terminals 401a are soldered; and a copper foil pattern 413b, which is a second copper foil pattern, to which the terminals 401b are soldered. The copper foil patterns 413a and 413b may be collectively referred to as copper foil patterns 413. The copper foil patterns 413 are covered by a resist 414 except where solder cream portions 412 are applied. The solder cream portions 412 and the copper foil patterns 413 are provided to correspond to the terminals 401 of the BD 6. The BD 6 in the first embodiment has three terminals 401 on one side of the substrate 410 and three terminals 401 on another side of the substrate 410. The solder cream portions 412 and the copper foil patterns 413 are provided, on the laser emission substrate 1, to correspond to the above six terminals 401. Because the terminals 401 are provided on the opposing sides of the substrate 410, the solder cream portions 412 and the copper foil patterns 413 are provided in an opposing arrangement on the laser emission substrate 1, as shown in FIG. 5A. That is, solder cream portions 412a, which are first solder cream portions, are applied to the copper foil pattern 413a, and solder cream portions 412b, which are second solder cream portions, are applied to the copper foil pattern 413b (an application step).

A feature of the first embodiment is a positional relationship among the solder cream portions 412, the terminals 401, and the copper foil patterns 413 as described below, in which D1: the distance between the opposing solder cream portions 412, D2: the distance between the opposing terminals 401, and D3: the distance between the opposing copper foil patterns 413.

The distances D1, D2 and D3 have a relationship in Formula (1) below.

$$D1 < D2 \leq D3 \quad \text{Formula (1)}$$

Because the distance D1 is shorter than the distances D2 and D3, the solder cream portions 412 are applied to extend inwardly (toward the center of the substrate 410) beyond the terminals 401 and the copper foil patterns 413. Usually, the solder cream portions 412 are not purposely applied to extend beyond the copper foil patterns 413, because the extendedly applied extra solder cream may create a short circuit between terminals or create solder balls. In the first embodiment, however, the solder cream portions 412 are intentionally applied to extend beyond the copper foil patterns 413 for a predetermined length, for example 0.3 mm. Applying the solder cream portions 412 to extend beyond the copper foil patterns 413 increases the accuracy of the mounting position of the BD 6 in reflowing.

As above, the solder cream portions 412a are applied such that one end of each solder cream portion 412a facing the corresponding solder cream portion 412b extends toward the solder cream portion 412b beyond one end of the corresponding terminal 401a facing the corresponding terminal 401b. The solder cream portions 412b are applied such that one end of each solder cream portion 412b facing the corresponding solder cream portion 412a extends toward the solder cream portion 412a beyond one end of the corresponding terminal 401b facing the corresponding terminal 401a. The solder cream portions 412a are applied such that the end of each solder cream portion 412a extends beyond one end of the copper foil pattern 413a facing the copper foil pattern 413b. The solder cream portions 412b are applied such that the end of each solder cream portion 412b extends beyond one end of the copper foil pattern 413b facing the copper foil pattern 413a.

As shown in Formula (1), the distance D1 between the end of each solder cream portion 412a and the end of each solder cream portion 412b is shorter than the distance D2 between the end of each terminal 401a and the end of each terminal 401b (D1<D2). The distance D1 between the end of each solder cream portion 412a and the end of each solder cream portion 412b is shorter than the distance D3 between the end of the copper foil pattern 413a and the end of the copper foil pattern 413b (D1<D3).

In reflowing, the extendedly applied solder cream portions 412 are fused and drawn toward the copper foil patterns 413 due to the self-alignment effect. At this point, the BD 6 on the solder cream portions 412 also moves toward the copper foil patterns 413 along with the solder cream portions 412. In the first embodiment, as shown in Formula (1), the distance D2 is equal to or shorter than the distance D3 (D2≤D3). Due to the self-alignment effect of the fused solder cream portions 412, in reflowing, the BD 6 moves to a position such that the inner lines of the terminals 401 exactly align with the inner lines of the copper foil patterns 413, or a position such that the midpoint of the distance D2 exactly aligns with the midpoint of the distance D3.

[Advantageous Effect]

Figure 6A:
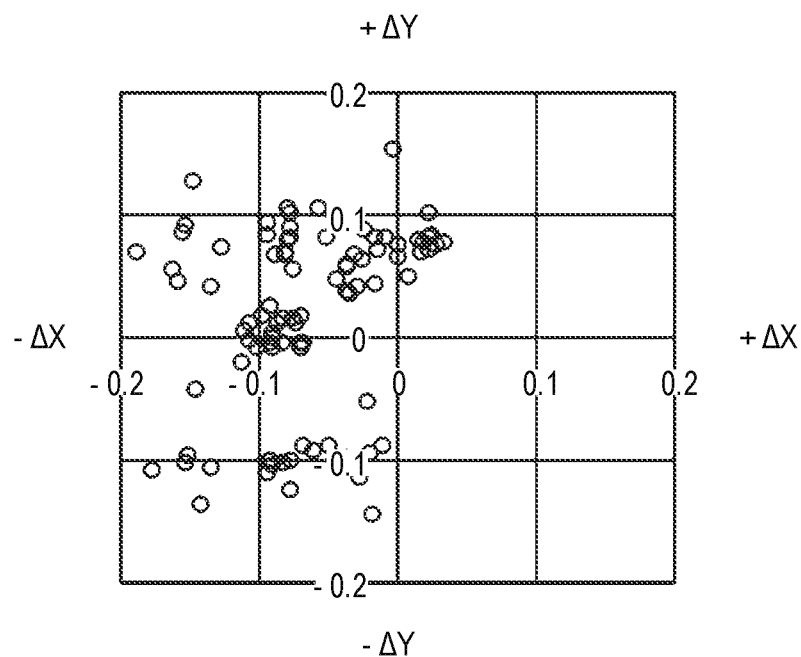
FIGS. 6A and 6B are diagrams for describing an advantageous effect of the method of mounting an electronic component in a reflow manner in the first embodiment.
Figure 6B:
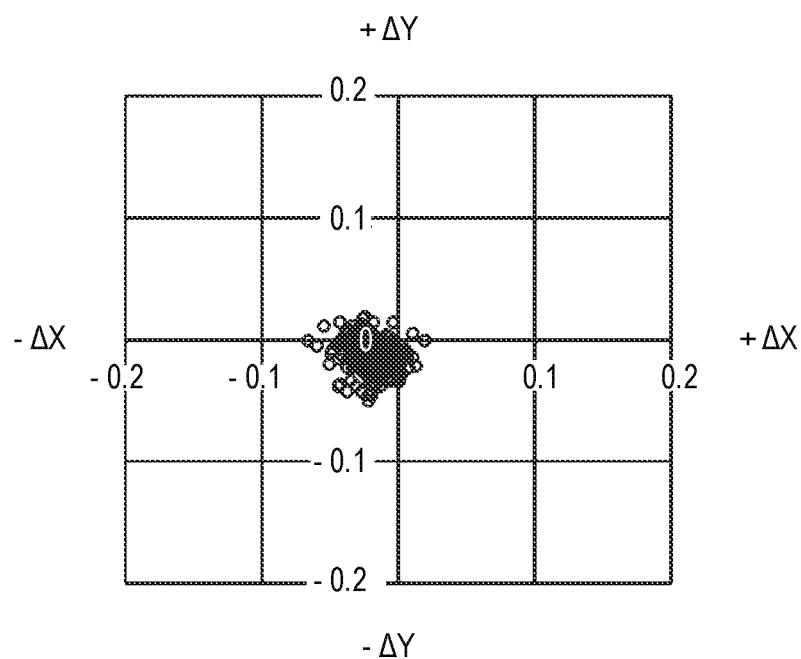

FIGS. 6A and 6B illustrate the results of verifying an advantageous effect of the reflow method in the first embodiment. The results in FIGS. 6A and 6B show deviations (±ΔX, ±ΔY) of the coordinates of the mounting positions of the BD 6 measured after reflowing from the designed mounting coordinates X, Y of the BD 6. FIG. 6A illustrates deviations in the cases where the solder cream portions 412 were applied not to extend toward the center of the substrate 410 beyond the terminals 401 and the copper foil patterns 413. By contrast, FIG. 6B illustrates deviations in the cases where the solder cream portions 412 were applied to extend toward the center of the substrate 410 beyond the terminals 401 and the copper foil patterns 413. Under either condition, the terminals 401 and the copper foil patterns 413 were in the relationship D2=D3.

As can be seen by comparing FIGS. 6A and 6B, in the cases where the solder cream portions 412 were applied to inwardly extend beyond the terminals 401 and the copper foil patterns 413, the range of variation in the mounting position was reduced in both X direction and Y direction. Specifically, it can be seen that the range of variation in the mounting position was improved from ±0.20 mm or greater in FIG. 6A to ±0.05 mm or smaller in FIG. 6B.

In order to prevent the extendedly applied extra solder cream portions 412 from creating a short circuit between the terminals 401 or creating solder balls, the first embodiment has the following feature. That is, no resist or pattern, except the copper foil patterns 413 for mounting, is provided on the surface of the laser emission substrate 1 that contacts the BD 6. More specifically, no resist or pattern is provided between the opposing copper foil patterns 413 provided on the laser emission substrate 1. That is, no resist or copper foil pattern is formed between the end of each solder cream portion 412a and the end of each solder cream portion 412b. Providing such copper foil pattern or resist on the surface of the laser emission substrate 1 that contacts the BD 6 would change how the solder flows when the extendedly applied solder cream portions 412 is fused and drawn toward the copper foil patterns 413 due to the self-alignment effect. This would lead to solder balls or to a short circuit between the terminals 401.

As described above, the method of reflow mounting in the first embodiment can increase the accuracy of the mounting position of the BD 6 on the laser emission substrate 1, thereby increasing the accuracy of attaching the BD 6 to the optical case 9. Thus, according to the first embodiment, the accuracy of mounting an electronic component onto a substrate can be increased.

[Mounting BD Onto Laser Emission Substrate]

Figure 7A:
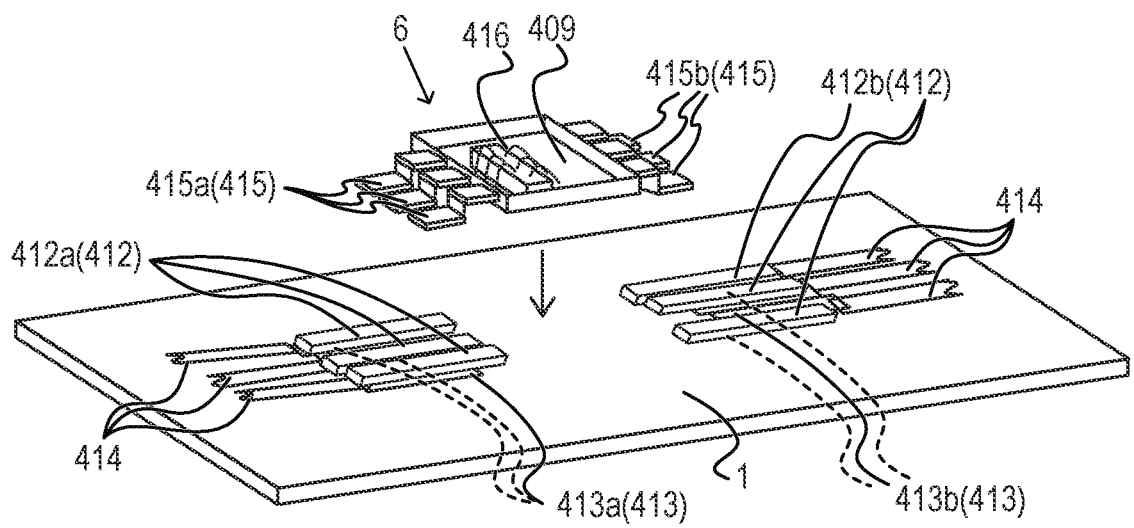
FIGS. 7A and 7B are diagrams for describing a method of mounting an electronic component in a reflow manner in the second embodiment.
Figure 7B:
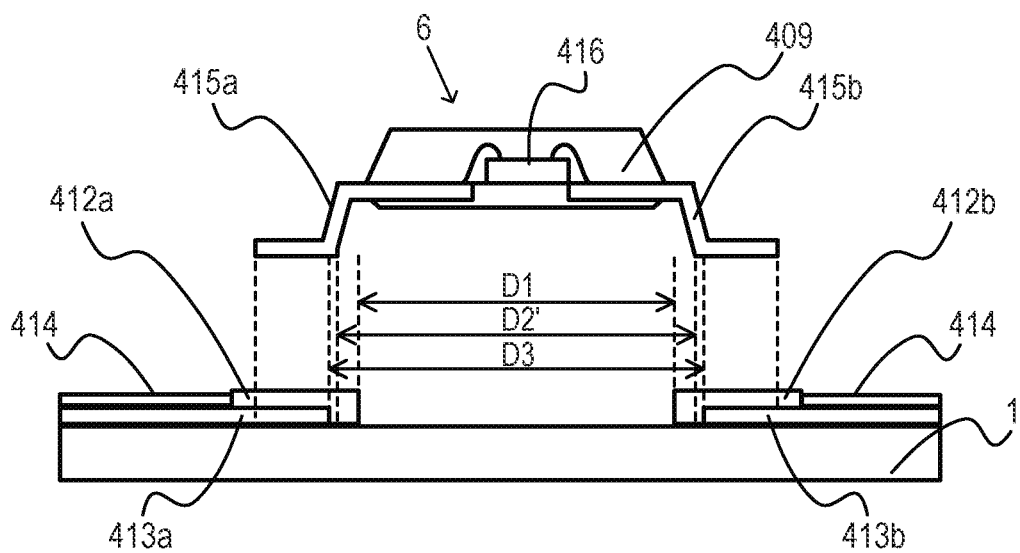

A second embodiment describes a case where a BD 6 of lead frame type is used. Components similar to those in the first embodiment will be given the same symbols and not be described again. The second embodiment also aims to increase the accuracy of mounting the BD 6 onto the laser emission substrate 1. FIGS. 7A and 7B are diagrams for describing mounting the BD 6 of lead frame type. As shown in a perspective view in FIG. 7A, the BD 6 of lead frame type has a structure in which a transparent acrylic resin 409 covers both a lead frame and a sensor IC 416, such as a photodiode, mounted on the lead frame. Part of the lead frame extends off the transparent acrylic resin 409 to form lead frame terminals 415 serving as joints for mounting the BD 6 onto the laser emission substrate 1. The lead frame terminals 415 are clinched. For example, three lead frame terminals 415a, which are first lead frame terminals, are provided on one side of the transparent acrylic resin 409. For example, three lead frame terminals 415b, which are second lead frame terminals, are provided on another side of the transparent acrylic resin 409 opposite to the one side. The lead frame terminals 415a and 415b may be collectively referred to as lead frame terminals 415. In the second embodiment, a total of six lead frame terminals 415 exist. Solder cream portions 412 (412a and 412b) and copper foil patterns 413 (413a and 413b) are provided on the laser emission substrate 1 in an opposing arrangement for the corresponding six lead frame terminals 415.

FIG. 7B shows a cross-sectional view. The copper foil patterns 413 are covered by a resist 414 except where the solder cream portions 412 are applied. A feature of the second embodiment is a positional relationship among the solder cream portions 412, the lead frame terminals 415, and the copper foil patterns 413 as described below, in which D1: the distance between the opposing solder cream portions 412, D2': the distance between the areas in the opposing lead frame terminals 415 where the lead frame terminals 415 contact the laser emission substrate 1 (clinched portions), and D3: the distance between the opposing copper foil patterns 413.

The distances D1, D2' and D3 have a relationship in Formula (2).

$$D1 < D2' \leq D3 \quad \text{Formula (2)}$$

Because the distance D1 is shorter than the distances D2 and D3, the solder cream portions 412 are applied to inwardly extend beyond the lead frame terminals 415 (their clinched or contact portions) and the copper foil patterns 413. Usually, the solder cream portions 412 are not purposely applied to extend beyond the copper foil patterns 413, because the extendedly applied extra solder cream portions 412 may create a short circuit between the lead frame terminals 415 or create solder balls. In the second embodiment, however, the solder cream portions 412 are intentionally applied to extend, for example for 0.3 mm. This is done because extendedly applying the solder cream portions 412 increases the accuracy of the mounting position of the BD 6 in reflowing.

As above, the distance D1 between the end of each solder cream portion 412a and the end of each solder cream portion 412b is shorter than the distance D2' between one end of each lead frame terminal 415a and one end of each lead frame terminal 415b (D1<D2'). Here, one end of each lead frame terminal 415a refers to the end facing the corresponding lead frame terminal 415b in the area where the lead frame terminal 415a contacts the copper foil pattern 413a. One end of each lead frame terminal 415b refers to the end facing the corresponding lead frame terminal 415a in the area where the lead frame terminal 415b contacts the copper foil pattern 413b. In reflowing, the extendedly applied solder cream portions 412 are fused and drawn toward the copper foil patterns 413 due to the self-alignment effect. At this point, the BD 6 on the solder cream portions 412 also moves toward the copper foil patterns 413 along with the solder cream portions 412.

In the second embodiment, the distance D2' is equal to or shorter than the distance D3 (D2'≤D3). Due to the self-alignment effect of the fused solder cream portions 412, in reflowing, the BD 6 moves in the following manner. If the distance D2' is equal to the distance D3, the BD 6 moves to a position such that the inner lines of the areas where the lead frame terminals 415 contact the laser emission substrate 1 exactly align with the inner lines of the copper foil patterns 413. If the distance D2' is shorter than the distance D3, the BD 6 moves to a position such that the midpoint of the distance D2 exactly aligns with the midpoint of the distance D3. Again, in the second embodiment, no resist or copper foil pattern is formed between the end of each solder cream portion 412a and the end of each solder cream portion 412b.

As described above, for a BD of lead frame terminal type, the method of reflow mounting in the second embodiment can increase the accuracy of the mounting position of the BD 6 on the laser emission substrate 1. This increases the accuracy of attaching the BD 6 to the optical case 9. Thus, according to the second embodiment, the accuracy of mounting an electronic component onto a substrate can be increased.

Third Embodiment

[Description of Laser Beam Printer]

Figure 8:
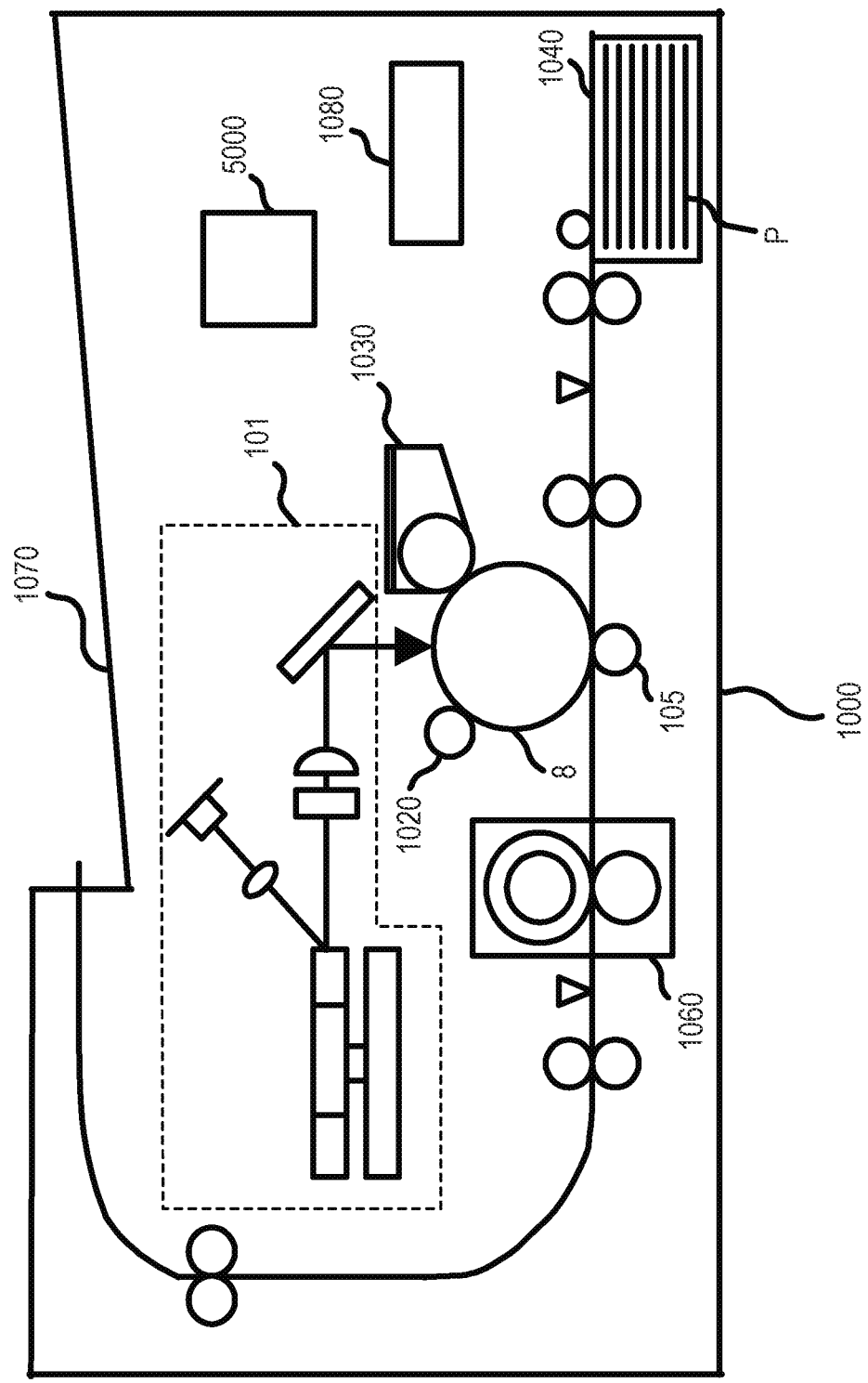
FIG. 8 is a schematic diagram of a laser beam printer in a third embodiment.

FIG. 8 illustrates a schematic configuration of a laser beam printer as an exemplary image forming apparatus having the scanning optical device 101 in the first and second embodiments. A laser beam printer 1000 (hereafter referred to as a printer 1000) includes a photosensitive drum 8, the scanning optical device 101, a charge device 1020, and a developing device 1030. The photosensitive drum 8 is a photosensitive member on which the scanning optical device 101 forms an electrostatic latent image. The charge device 1020 uniformly charges the photosensitive drum 8. The developing device 1030 serving as a developing unit develops, with toner, the electrostatic latent image formed on the photosensitive drum 8, thereby forming a toner image. A sheet P serving as a recording material is supplied from a cassette 1040, and the toner image formed on the photosensitive drum 8 (the photosensitive member) is transferred onto the sheet P by a transfer device 1050 serving as a transfer unit. The unfixed toner image transferred onto the sheet P is fixed by a fixing device 1060, and the sheet P is ejected onto a tray 1070. The scanning optical device 101, the photosensitive drum 8, the charge device 1020, the developing device 1030, and the transfer device 1050 constitute an image forming unit. The printer 1000 includes a power supply device 1080, which supplies power to driving units such as motors and to a control unit 5000. The control unit 5000 has a CPU (not shown) and controls image forming operations by the image forming unit and operations of conveying the sheet P, for example. It is to be noted that image forming apparatuses to which the scanning optical device of the present invention can be applied are not limited to those configured as illustrated in FIG. 8.

Thus, according to the third embodiment, the accuracy of mounting an electronic component onto a substrate can be increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-001342, filed Jan. 8, 2020, which is hereby incorporated by reference herein in its entirety.

What is claimed is:

1. A substrate on which at least one electronic component having at least one first terminal provided along one side of the at least one electronic component and at least one second terminal provided along another side of the at least one electronic component opposed to the one side of the at least one electronic component, the substrate comprising:

a first copper foil pattern to be soldered with the at least one first terminal;

a second copper foil pattern to be soldered with the at least one second terminal;

a first solder portion applied onto the first copper foil pattern; and a second solder portion applied to the second copper foil pattern, wherein a first end of the first solder portion facing the second solder portion is applied to extend toward the second copper foil pattern beyond a first end of the first copper foil pattern facing the second copper foil pattern, and wherein a first end of the second solder portion facing the first solder portion is applied to extend toward the first copper foil pattern beyond a first end of the second copper foil pattern facing the first copper foil pattern, wherein the first end of the first solder portion is applied to extend toward the second copper foil pattern beyond a first end of the at least one first terminal facing the at least one second terminal, and the first end of the second solder portion is applied to extend toward the first copper foil pattern beyond a first end of the at least one second terminal facing the at least one first terminal.

2. The substrate according to claim 1, wherein a distance between the first end of the first solder portion and the first end of the second solder portion is shorter than a distance between the first end of the first copper foil pattern and the first end of the second copper foil pattern.

3. The substrate according to claim 1, wherein a distance between the first end of the first solder portion and the first end of the second solder portion is shorter than a distance between the first end of the at least one first terminal and the first end of the at least one second terminal.

4. The substrate according to claim 3,
wherein the at least one first terminal is a first lead frame terminal,
wherein the at least one second terminal is a second lead frame terminal, and
wherein the distance between the first end of the first solder portion and the first end of the second solder portion is shorter than a distance between one end facing the second lead frame terminal in an area where the first lead frame terminal contacts the first copper foil pattern, and one end facing the first lead frame terminal in an area where the second lead frame terminal contacts the second copper foil pattern.

5. The substrate according to claim 1, wherein no resist or no copper foil pattern is formed between the first end of the first solder portion and the first end of the second solder portion.

6. The substrate according to claim 1, further comprising:
a circuit board;
a light source mounted on the circuit board; and
an output unit configured to output a signal in response to receiving light emitted from the light source.

* * * * *